US 9,537,451 B2

(12) United States Patent
Inoue

(10) Patent No.: US 9,537,451 B2
(45) Date of Patent: Jan. 3, 2017

(54) AMPLIFIER HAVING ENHANCED POWER EFFICIENCY

(71) Applicant: Sumitomo Electric Device Innovations, Inc., Yokohama-shi (JP)

(72) Inventor: Shingo Inoue, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/558,196

(22) Filed: Dec. 2, 2014

(65) Prior Publication Data
US 2016/0156317 A1    Jun. 2, 2016

(51) Int. Cl.
 *H03F 3/04* (2006.01)
 *H03F 1/02* (2006.01)
 *H03F 3/19* (2006.01)
 *H03F 3/217* (2006.01)

(52) U.S. Cl.
 CPC .......... *H03F 1/0233* (2013.01); *H03F 1/0222* (2013.01); *H03F 3/19* (2013.01); *H03F 3/217* (2013.01); *H03F 2200/102* (2013.01); *H03F 2200/432* (2013.01); *H03F 2200/451* (2013.01); *H03F 2200/504* (2013.01)

(58) Field of Classification Search
 CPC ............ H03F 1/02; H03F 1/0233; H03F 1/32; H03F 3/19; H03F 1/21; H03F 1/24; H03F 2200/451; H03F 2200/504
 USPC ....... 330/127, 134, 136, 138, 140, 296, 297; 323/222, 235, 274, 282, 284, 285, 289, 323/317, 351
 See application file for complete search history.

(56) References Cited

U.S. PATENT DOCUMENTS

| 8,803,605 B2* | 8/2014 | Fowers | H03F 1/0238 330/127 |
| 2005/0242875 A1* | 11/2005 | Gurvich | H03F 1/0211 330/136 |
| 2013/0141169 A1* | 6/2013 | Khlat | H03F 1/0211 330/297 |
| 2013/0321076 A1* | 12/2013 | Galbis | H03F 1/0216 330/127 |
| 2015/0326186 A1* | 11/2015 | Hong | H03F 1/0238 330/291 |

FOREIGN PATENT DOCUMENTS

JP      2013-009200 A    1/2013

OTHER PUBLICATIONS

Coates, E., "Power Supplies Modules 3.0", 2007-2013, Article on SMPS posted on internet site, www.learnabout-electronics.org and publised and updated between 2007-2013.*

(Continued)

*Primary Examiner* — Steven J Mottola
*Assistant Examiner* — Hafizur Rahman
(74) *Attorney, Agent, or Firm* — Venable LLP; Michael A. Sartori; Laura G. Remus

(57) ABSTRACT

An RF amplifier with enhance power efficiency is disclosed. The RF amplifier traces the envelope of the input RF signal and varies the supply voltage to the final FET depending on the detected envelope through a linear power supply and a switching power supply superposed on the linear power supply. The linear power supply promptly responds the change of the envelope and gradually decreases the supply current as maintaining the supply voltage. The switching power supply takes over the supplement of the supply current to the final FET.

14 Claims, 13 Drawing Sheets

(56) References Cited

OTHER PUBLICATIONS

Lai et al., "A Zero Input Current Ripple ZVS/ZCS Boost Converter with Boundary-Mode Control", on-line magazine, energies ISSN 1996-1073, Received: Aug. 9, 2014; in revised form: Sep. 24, 2014 / Accepted: Oct. 14, 2014 / Published: Oct. 20, 2014.*
Swartz, Cris, R., "Novel zero-voltage switching topology enhances buck regulator's performance", article publised in ECN Magazine, Aug. 2012.*
"Base station market rewards Freescale and NXP", Microwave Journal, Oct. 28, 2014.*

* cited by examiner

AMPLIFIER HAVING ENHANCED POWER EFFICIENCY

TECHNICAL FIELD

The present application relates to a radio frequency (RF) amplifier that enhances the power efficiency by implementing a switching power supply concurrently with a linear power supply.

BACKGROUND

One technique has been well known in the field to reduce the power dissipation, namely, to enhance the power efficiency, which is called as the envelope tracking technique where an RF amplifier adjusts or varies the power supply voltage depending on the envelope of an input RF signal.

SUMMARY

An aspect of the present invention relates to an amplifier that amplifies RF signals. The RF amplifier of the present invention includes a FET, a linear power supply, and a switching power supply. The FET, supplied with a supply voltage and a supply current, amplifies the input RF signals. The linear power supply provides, to the FET by receiving the source power supply, the supply voltage that traces an envelope of the input RF signals and a portion of the supply current. The switching power supply provides, to the FET by receiving the source power supply, a rest portion of the supply current. The portion of the supply current is preferably limited to the preset limit, while, the rest portion of the supply current provided from the switching power supply is an amount exceeding the preset limit. The switching power supply may be the step-up configuration and/or the step-down configuration.

BRIEF DESCRIPTION OF THE DRAWINGS

The present invention will now be described by way of example only and not in any limitative sense with reference to the accompanying drawings in which.

DETAILED DESCRIPTION

Next, some embodiments of the present invention will be described as referring to drawings. In the description of the drawings, numeral or symbols same with or similar to each other will refer to elements same with or similar to each other without duplicating explanations.

First Embodiment

Figure 1:
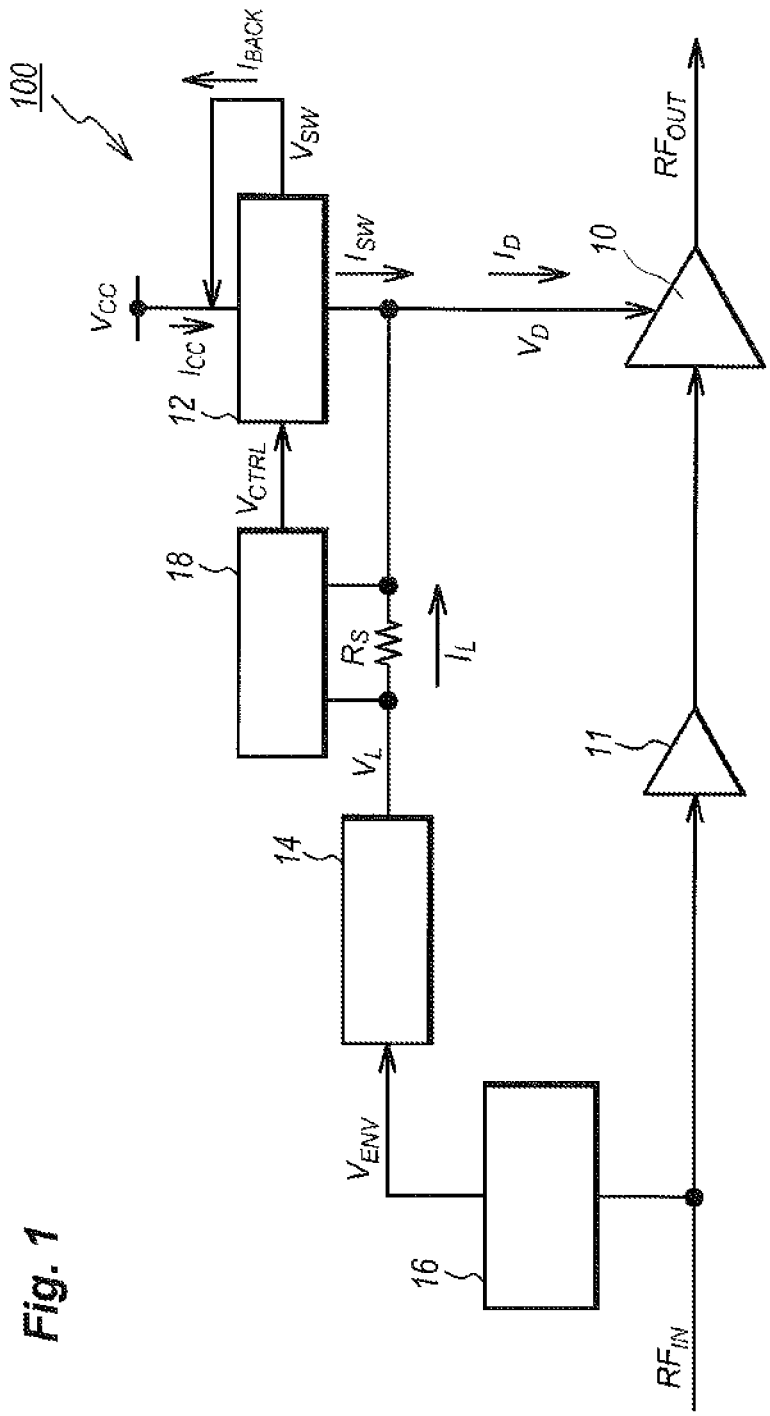
FIG. 1 shows a functional block diagram of an RF amplifier according to the first embodiment of the present invention.

FIG. 1 is a functional block diagram of an amplifier according to the first embodiment of the present invention. The amplifier 100 has the two-stage including a final section 10 and a front section 11. Power supply of the amplifier 100 includes a switching power supply 12, a linear power supply 14, an envelope detector 16, and a current detector 18 accompanied with a sensing resistor $R_S$. A radio frequency (RF) signal $RF_{IN}$ is input to the front section 11 and the envelope detector 16. The final section 10 further amplifies an output of the front section 11 to be output as a signal $RF_{OUT}$.

The envelope detector 16 detects an envelope of the RF input $RF_{IN}$ to output an envelope signal $V_{ENV}$. The linear power supply 14 generates a primary power $V_L$ based on the envelope signal $V_{ENV}$, and provides the primary power $V_L$ to the final section 10 through the sensing resistor $R_S$. The switching power supply 12, which is supplied with the source power supply $V_{CC}$. The switching power supply 12 is a type of, what is called, the step-up configuration, where an output voltage thereof is higher than an input voltage. In the present embodiment, the switching power supply 12 whose enhanced output $V_{SW}$ is fed-back to the input, namely, the source power supply $V_{CC}$ through a load, but the reference level thereof is coupled with the final section 10. Thus, the switching power supply 12 may provide an additional current $I_{SW}$ which is a sum of the current $I_{CC}$ provided from the source power supply $V_{CC}$ and a current $I_{BACK}$ back to the source power supply $V_{CC}$ from the step-up output $V_{SW}$, to the final section 10 in addition to the load current $I_L$ provided from the linear power supply 14.

The current detector 18 measures a voltage drop caused by the load current $I_L$, flowing in the sensing resistor $R_S$, and controls the switching power supply 12 such that the load current $I_L$ does not exceed a preset limit. That is, when the load current $I_L$ is going to exceed the preset limit, the current detector 18 controls the switching power supply 12 to provide an additional current $I_{SW}$. Then, the final section 10 is provided with a merged current, $I_L + I_{SW}$.

An amplifier with the envelope tracking function may enhance the power efficiency by varying the power supply provided to the final section 10 based on the envelope the input signal $RF_{IN}$. A linear power supply 14 may follow the envelope of the input signal $RF_{IN}$ but is inferior in an aspect of the power efficiency. On the other hand, a switching power supply inherently has superior power efficiency but unable to follow the envelope of the input signal. The amplifier 100 of the present embodiment, the linear power supply 14 primarily provides power to the final section 10 when the input signal $RF_{IN}$ varies the envelope thereof promptly, while, the switching power supply 12 primarily provides the power to the final section 10 when the envelope of the input signal $RF_{IN}$ varies moderately. Thus, the high efficiency in the power consumption may be consistent with the prompt response for the envelope of the input signal in the amplifier 100. In a major application of the amplifier 100, typically the application of the base station of the mobile telephone system, the envelope of the input signal $RF_{IN}$ usually varies in moderate.

Figure 2:
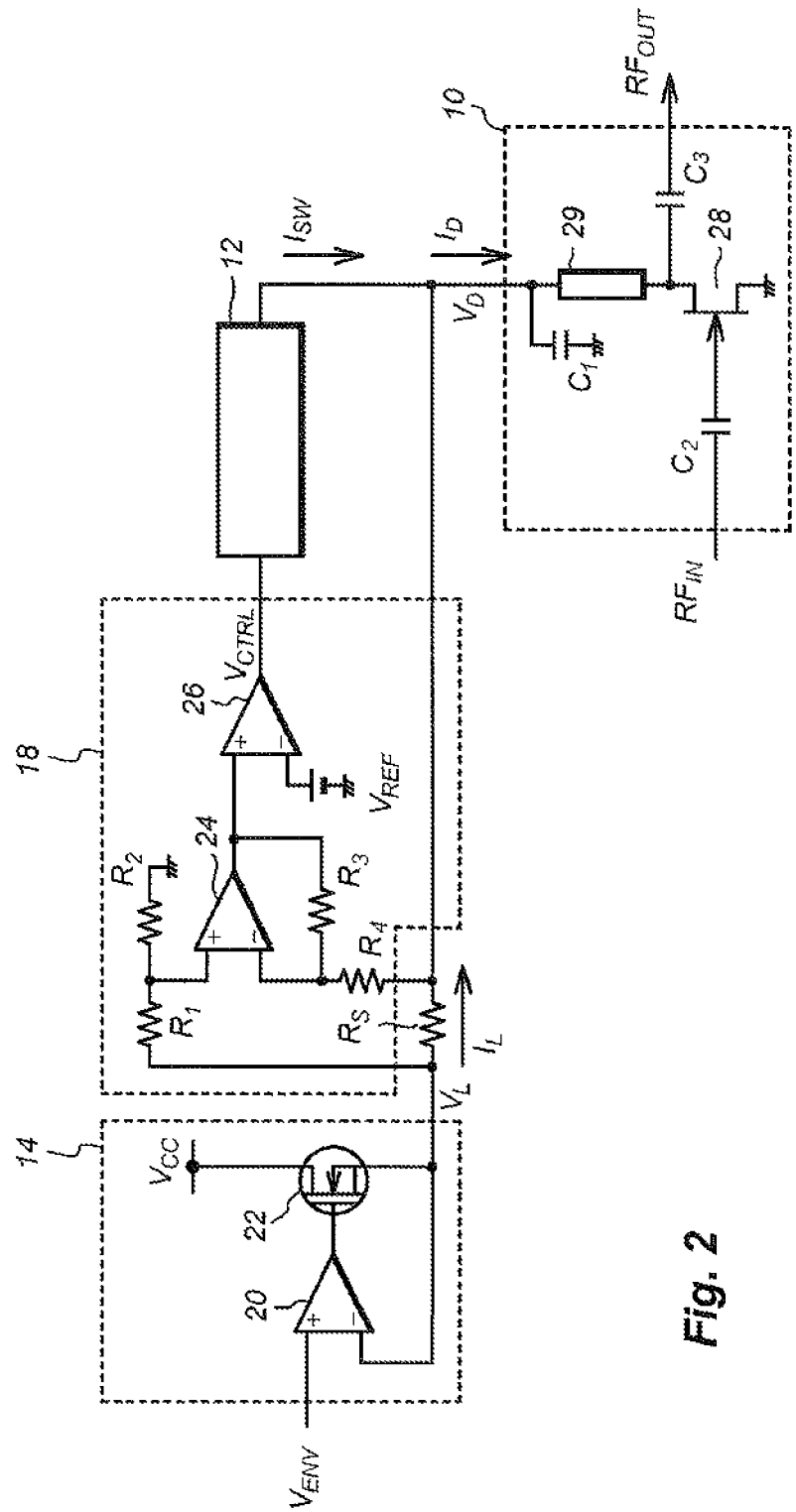
FIG. 2 shows a circuit diagram of a final section, a linear power supply and a current detector implemented in the RF amplifier shown in FIG. 1.

FIG. 2 shows exemplary circuits of the linear power supply 14, the current detector 18, and the final section 10 appearing in FIG. 2. The linear power supply 14 of the present embodiment provides a differential amplifier 20 and a buffer transistor 22, which is an n-MOSFET. The linear power supply 14 of the present embodiment forms a voltage follower circuit that traces the non-inverting input of the differential amplifier 20 in the source of the transistor 22. The transistor 22 operates as a current buffer to supply a large current $I_L$ unable for the differential amplifier to output.

The current detector 18 includes two differential amplifiers, 24 and 26, and four resistors, $R_1$ to $R_4$. The first differential amplifier 24 amplifies a voltage signal generated in the sensing resistor $R_S$ by the output current $I_L$ of the liner power supply 14 flowing therein. Four resistors, $R_1$ to $R_4$, determine the voltage gain of the first differential amplifier 24. The second differential amplifier 26 compares the output of the first differential amplifier 24 with a reference $V_{REF}$, and outputs a difference therebetween. That is, because the output of the first differential amplifier 24 corresponds to the current $I_L$ flowing in the sensing resistor $R_S$, the reference $V_{REF}$ is equivalently equal to the preset limit current of the linear power supply 14. The second amplifier 26 generates an excess amount of the supply current $I_L$ from the preset limit as voltage signal $V_{CTRL}$.

The final section 10 includes an FET type of the high electron mobility transistor (HEMT), capacitors, $C_1$ to $C_3$, and a stub 29. The HEMT of the present embodiment is, for instance, made of nitride semiconductor material such as gallium nitride (GaN) with a channel layer made of GaN formed on a substrate and a earner supply layer made of AlGaN provided on the channel layer. The FET 28 is grounded in the source thereof, receives in the gate thereof the input signal $RF_{IN}$ amplified by the front section 11 through the coupling capacitor $C_2$, and outputs the amplified signal $RF_{OUT}$ from the drain thereof through another coupling capacitor $C_3$. The drain of the FET 28 is also supplied with the power $V_D$ through the bypassing capacitor $C_1$ and the stub 29.

Figure 3:
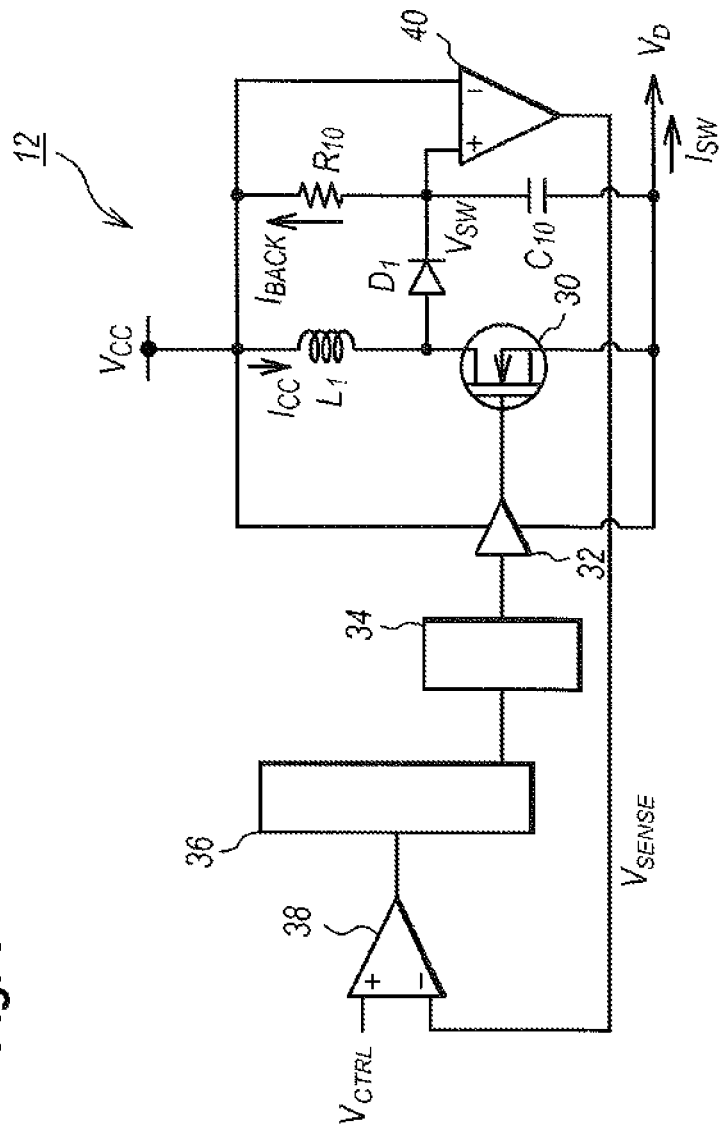
FIG. 3 shows a circuit diagram of a switching power supply with the step-up configuration implemented in the RF amplifier shown in FIG. 1.

FIG. 3 shows a circuit diagram of the switching power supply 12. As shown in FIG. 3, the switching power supply 12 of the embodiment has, what is called, the step-up configuration that includes an FET 30, a gate driver 32, a level shifter 34, a pulse generator, exactly, a pulse width modulation (PWM) circuit 36, differential amplifiers, 38 and 40, a diode $D_1$, a capacitor $C_{10}$, an inductor $L_1$, and a resistor $R_{10}$. The FET 30 of the present embodiment is the type of the n-MOSFET, preferably, n-type power MOSFET.

The inductor $L_1$, the FET 30 as a switching element, the diode $D_1$, and the capacitor $C_{10}$ operate as the step-up switching circuit with the source power supply $V_{CC}$ as the input, the cathode of the diode $D_1$, namely, the non-inverting input of the differential amplifier 40 as the output $V_{SW}$, and the output $V_D$ as the reference. Specifically, when the FET 30 turns on by being driven by the gate driver, which sets the drain level of the FET substantially equal to the reference $V_D$ and reversely biases the diode $D_1$; not only the current flows in the inductor $L_1$ and the FET 30 but the inductor $L_1$ stores energy. Subsequently, turning off the FET 30, which shuts the current flowing in the inductor $L_1$ to release the energy stored therein, the output $V_{SW}$ becomes the source power supply $V_{CC}$ added with the energy stored in the inductor $L_1$. Accordingly, the output $V_{SW}$ exceeds the source power supply $V_{CC}$. The capacitor $C_{10}$ is a smoothing capacitor for the output $V_{SW}$.

The PWM circuit 36 generates a pulse signal with a variable duty ratio depending on the output of the first differential amplifier 38. When the output of the first differential amplifier 38 becomes higher, the duty ratio of the pulse signal output from the PWM circuit increases, which enhances the output $V_{SW}$. The level shifter 34 shifts the output of the PWM circuit 36 to levels adequate for driving the gate driver 32 and the FET 30.

The differential amplifier 40 senses a difference between the output $V_{SW}$ and the source power supply $V_{CC}$, and feeds this difference back to the inverting input of the first differential amplifier 38 as a sensing signal $V_{SENSE}$. The first differential amplifier 38 receives the control signal $V_{CTRL}$ that corresponds to the excess amount of the output current $I_L$ of the linear power supply 14 from the preset limit. Accordingly, the first differential amplifier 38 generates an output thereof such that the sensing signal $V_{SENSE}$ becomes equal to the control signal $V_{CTRL}$. Thus, the output $V_{SW}$ of the switching power supply 12 is operated so as to become higher than the source power supply $V_{CC}$ by the control signal $V_{CTRL}$, $V_{SW}=V_{CC}+V_{CTRL}$.

When the sensing signal $V_{SENSE}$ lower than the control signal $V_{CTRL}$, switching power supply 12 operates so as to increase the output $V_{SW}$, which means that the current flowing in the transistor 30 increases. As described, the control signal $V_{CTRL}$ corresponds to an excess amount of the output current $I_L$ from the preset limit, accordingly, the switching power supply 12 compensates excess amount of the linear power supply 14. The output current $I_L$ of the linear power supply 14 does not exceed the present limit.

The switching power supply 12 thus described in FIG. 3 has the type of, what is called, the asynchronous rectification; however, the switching power supply 12 may provide the type of the synchronous rectification. Also, the FET 30 may be a p-type FET, and/or other types of a switching element, such as a bipolar transistor and so on.

Figure 4:
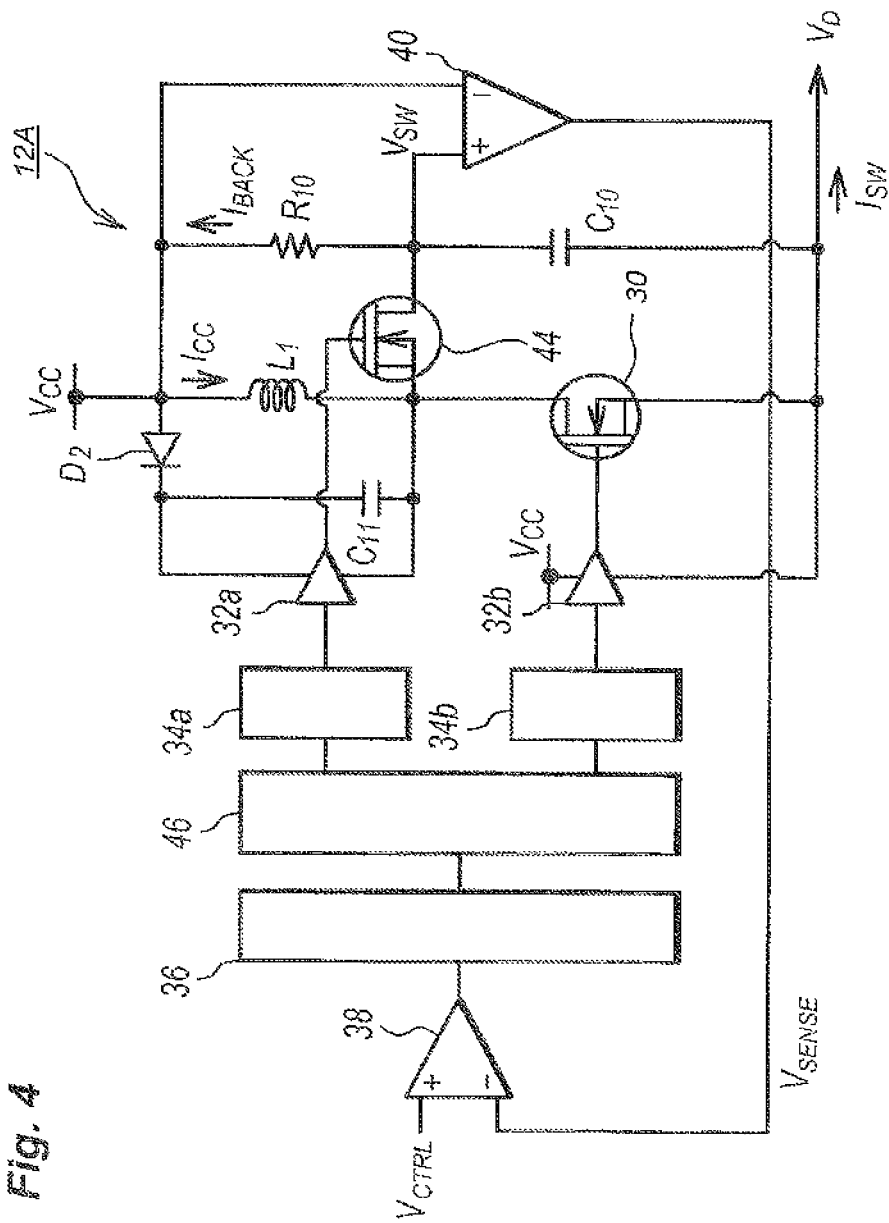
FIG. 4 shows a circuit diagram of another switching power supply also having the step-up configuration.

FIG. 4 shows another type of the step-up switching power supply 12A having the type of the synchronous rectification. The switching power supply 12A of FIG. 4 provides, substituting for the diode $D_1$, another n-MOSFET 44 driven by the high side circuit of the level shifter 34a and the gate driver 32a. The other FET 30 is driven by the low side circuit of the level shifter 34b and the gate driver 32b. Two FETs, 30 and, 44 alternately turn on/off. That is, when the FET 30 turns on to flow the current therein and store the energy in the inductor $L_1$, the other FET 44 turns off to isolate the inductor $L_1$ from the output $V_{SW}$. On the other hand, when the FET 30 is turned off, the other FET 44 is turned on to couple the inductor $L_1$ with the output $V_{SW}$. In the synchronous switching power supply 12A further provides a dead-time controller 46 put between the PWM circuit 36 and the level shifters, 34a and 34b. The dead time controller 46 adjusts the pulse widths each provided to respective FETs, 30 and 44, so as not to overlap, or not to turn on both FETs, 30 and 44, at the same time.

Figure 5A:
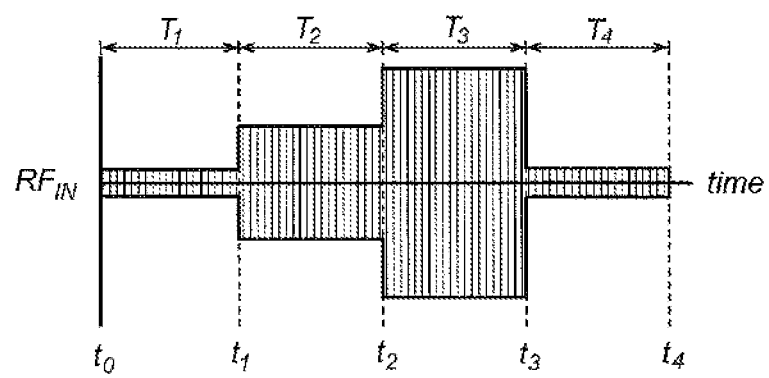
FIG. 5A shows an example of an input RF signal $RF_{IN}$.
Figure 5B:
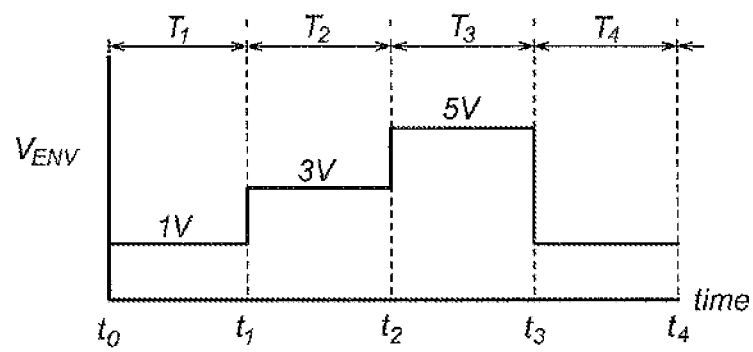
FIG. 5B shows an envelope $V_{ENV}$ of the input RF signal shown in FIG. 5A.

FIGS. 5A and 5B schematically illustrate the input signal $RF_{IN}$ and the envelope $V_{ENV}$ thereof, respectively. The input signal $RF_{IN}$ has relatively small amplitude for the period $T_1$ until the instance $t_1$, increases the amplitude thereof for the next period $T_2$ until the instance $t_2$, further increases for the next period $T_3$ until $t_3$, and recovers the initial amplitude for the next period $T_4$ until $t_4$. The envelope $V_{ENV}$ of the input signal $RF_{IN}$ shown in FIG. 5B, which corresponds to the amplitude of the input signal $RF_{IN}$, becomes 1 V during the periods, $T_1$ and $T_4$, 3 V during the period $T_2$, and 5 V for the period $T_3$, respectively. In an example shown in FIG. 5A, the input signal $RF_{IN}$ maintains the amplitude within respective periods. However, the input signal $RF_{IN}$ is not restricted to those configurations; the input signal $RF_{IN}$ may vary the amplitude during respective periods.

Figure 6A:
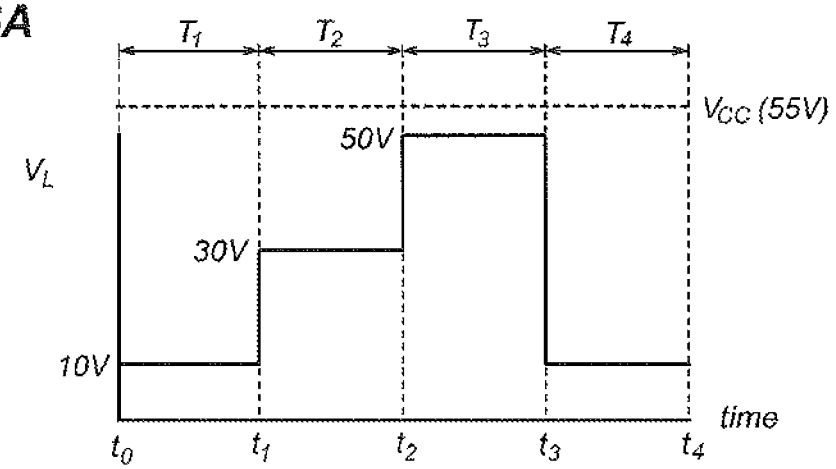
FIGS. 6A to 6C show examples of the output voltage $V_L$, the output current $L_L$, and the power dissipation $P_L$ of the linear power supply corresponding to the input RF signal $RF_{IN}$ shown in FIG. 5A.
Figure 6B:
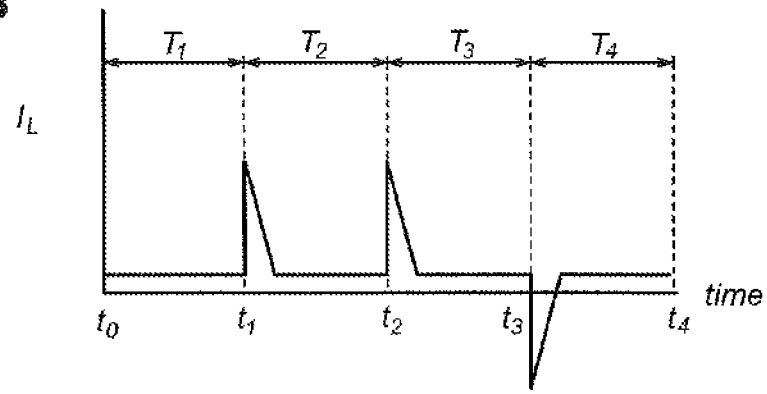
Figure 6C:
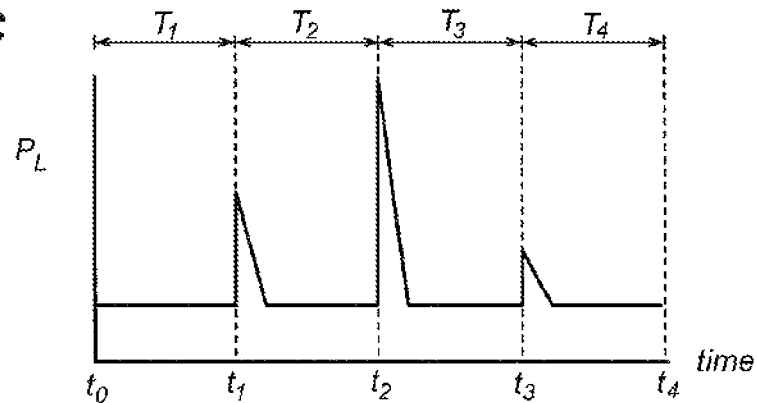

FIGS. 6A to 6C schematically illustrate the output voltage $V_L$, the output current $I_L$, and the power $P_L$ of the linear power supply 14. The output voltage $V_L$ substantially traces the envelope signal $V_{ENV}$ shown in FIG. 5B, assumes magnitudes thereof in respective periods, $T_1$ to $T_4$, to be 10 V, 30 V, 50 V, and 10 V. An explanation below further assumes the source power supply $V_{CC}$ to be 55 V. Because the linear power supply 14 promptly follows the envelope signal $V_{ENV}$, the current output $I_L$ thereof rapidly increases or decreases synchronous with the rising/falling of the output voltage $V_L$. However, setting the preset limit of the output current of the linear power supply 14 to be relatively small, the switching power supply 12 may operate so as to compensate the excess amount of the output current $I_L$, and the output current $I_L$ gradually decreases to the preset limit. The output power, $P_L=V_L \times I_L$, momently increases synchronous with the rising/falling of the envelope signal $V_{ENV}$, but may maintain relatively small value.

Figure 7A:
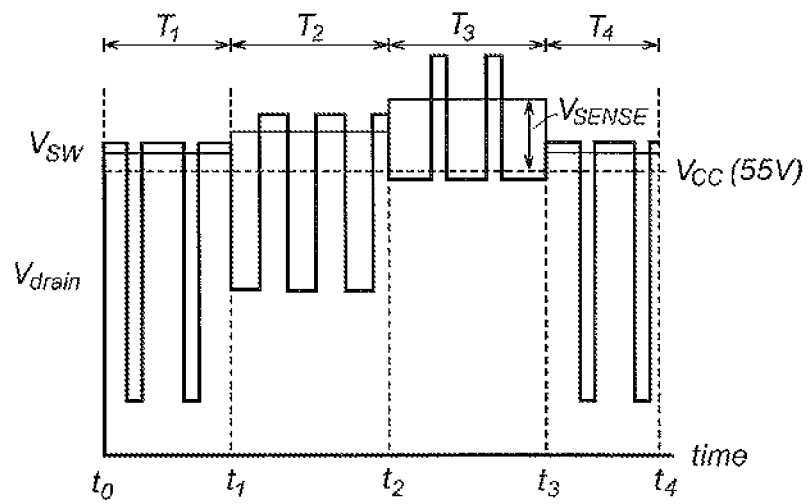
FIGS. 7A to 7C show examples of the output voltage $V_{SW}$ of the switching power supply, the drain level $V_{drain}$ of the switching FET, the output current $I_{SW}$ of the switching power supply, which is equivalent to the source current of the FET, and the power dissipation $P_{FET}$ of the FET, which is substantially equal to the power dissipation of the switching power supply.
Figure 7B:
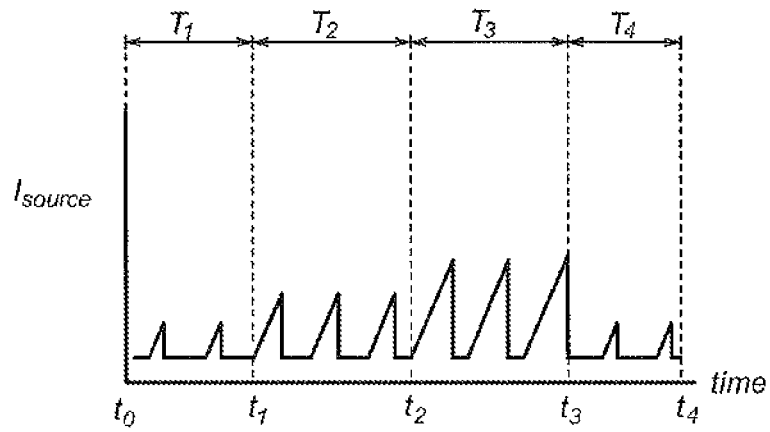
Figure 7C:
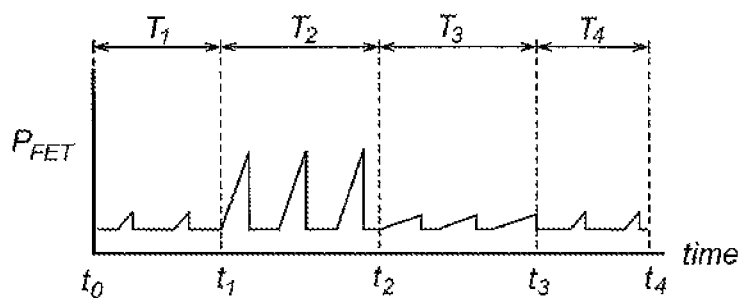

FIGS. 7A to 7C schematically show the drain voltage $V_{drain}$, the source current $I_{source}$, and the power consumption of the FET 30, respectively. The source current $I_{source}$ is substantially equal to the power consumption of the switching power supply 12. As shown in FIG. 7A, LOW level of the drain voltage $V_{drain}$ is substantially equal to the reference level $V_D$, namely, the output voltage of the linear power supply 14; that is, LOW level corresponds to the status where the FET 30 fully turns on and the drain level thereof becomes the source level which is equal to the output voltage $V_D$ of the linear power supply 14. While, HIGH level of the FET 30 exceeds the output $V_{SW}$ because of tire energy stored in the inductor L1 during the period the FET 30 turns on. For the periods, $T_1$ and $T_4$, LOW level of the drain voltage $V_{drain}$ is about 10 V, which is substantially equal to the output voltage of the linear power supply 14, and the ratio of a period when the FET fully turns on (LOW) against the total period (HIGH+LOW), becomes a minimum, which means lowest energy be stored in the inductor $L_1$. For the period $T_2$, the low level of the drain voltage $V_{drain}$ also becomes the output voltage of the linear power supply 14, which is about 30 V, and the ratio above increases compared with that for the periods, $T_1$ and $T_4$. For the period $T_3$, the low level of the drain voltage $V_{drain}$ further increases to about 50 V, which is also the output voltage $V_L$ of the linear power supply 14, and the ratio above becomes a maximum, which means the maximum energy be stored in the inductor $L_1$.

As shown in FIG. 7B, the source current $I_{source}$ linearly increases for periods when the FET 30 turns on, where the slope of the linear increase depends on the inductance of the inductor $L_1$. Because the period $T_3$ shows the maximum ratio of the period when the FET 30 tarns on against the total period, that is, the period $T_3$ shows a longest period when the FET 30 turns on, the final drain current becomes the maximum compared with those of other periods, $T_1$, $T_2$, and $T_4$. The current output from the switching power supply 12 to the final section 10 corresponds to an average of the source current $I_{source}$; accordingly, the period $T_3$ provides a maximum current to the final section 10; while, the periods, $T_1$ and $T_4$, provides a minimum current.

As shown in FIG. 7C, because the switching power supply 12 is put between the source power supply $V_{CC}$ and the output of the linear power supply 14, the power consumption of the switching power supply 12, which is equivalently equal to the power consumption $P_{FET}$ of the FET 30, is calculated by multiplying a voltage difference between the source power supply $V_{CC}$ and the output $V_L$ of the linear power supply 14 with a current flowing in the FET 30. The current flowing in the FET 30 becomes the maximum for the period $T_3$ but the voltage difference becomes the minimum. Accordingly, the power consumption of the FET 30 may be kept small. Similarly, the periods, $T_1$ and $T_4$, shows the maximum voltage difference, but the small current flowing in the FET 30. Then the power consumption of the FET 30 is kept small. The period $T_2$ shows a moderate voltage difference and a moderate current flowing; accordingly, the power consumption of the FET 30 becomes a maximum.

Thus, the amplifier 100 of the present embodiment varies the supplying voltage $V_D$ to the final section 10 depending on the envelope of the input RF signal $RF_{IN}$. When the envelope rapidly varies, the linear power supply 14 promptly follows a change of the envelope, that is, the linear power supply 14 rapidly supplies the increased current to the final section 10, and the switching power supply subsequently compensates a most portion of the increased current excessing the preset limit such that the linear power supply 14 reduces the output current $I_L$. Thus, two power supplies, 12 and 14, of the present embodiment, the linear power supply 14 provides the voltage $V_D$, while, the switching power supply 12 provides a primary portion of the current $I_D$. Moreover, the rapid transitions of the envelope of the input RF signal $RF_{IN}$ may be followed by the linear power supply 14.

Figure 8:
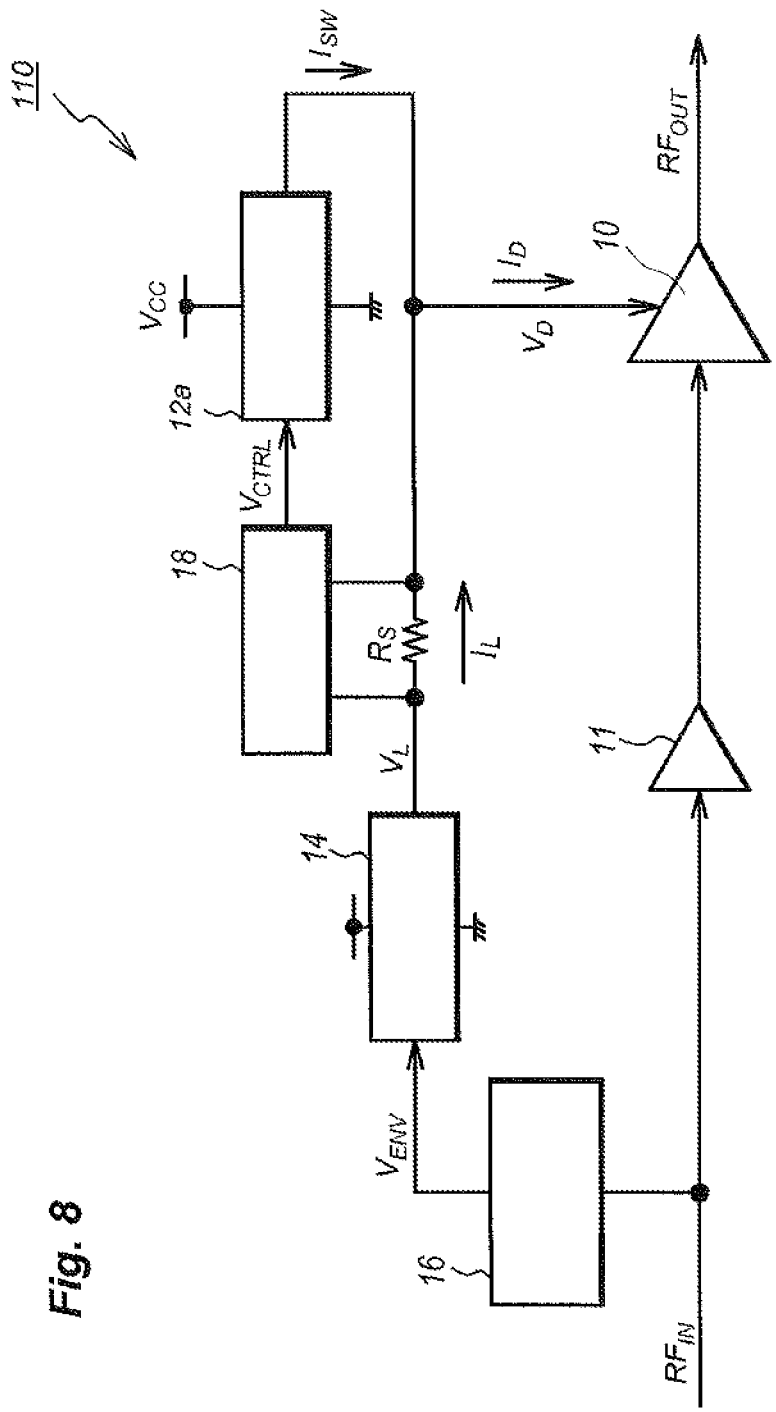
FIG. 8 shows a functional block diagram of an RF amplifier according to an example comparable to the embodiment of the present invention.

Next, further enhancement of the efficiency of the amplifier according to a modification of the first embodiment will be described as comparing with a comparable example. FIG. 8 is a functional block diagram of an amplifier according to a comparable example. The amplifier 110 includes a switching power supply 12a but the type of the step-down configuration. The switching power supply 12a converts the source power supply $V_{CC}$ down to a voltage less than the source power supply $V_{CC}$. The current detector 18 drives the switching power supply 12a such that the current $I_L$ output from the linear power supply 14 does not exceed the preset limit. Other arrangements of the amplifier 110 are same with those of the first embodiment. Specifically, the switching power supply 12a of the comparable example generates the output current $I_{SW}$ just equal to a portion of the output current $I_L$ of the linear power supply 14 excessing from the preset limit under the condition that the output voltage of the switching power supply 12a equal to the supply voltage $V_D$ for the final section 10.

Figure 9:
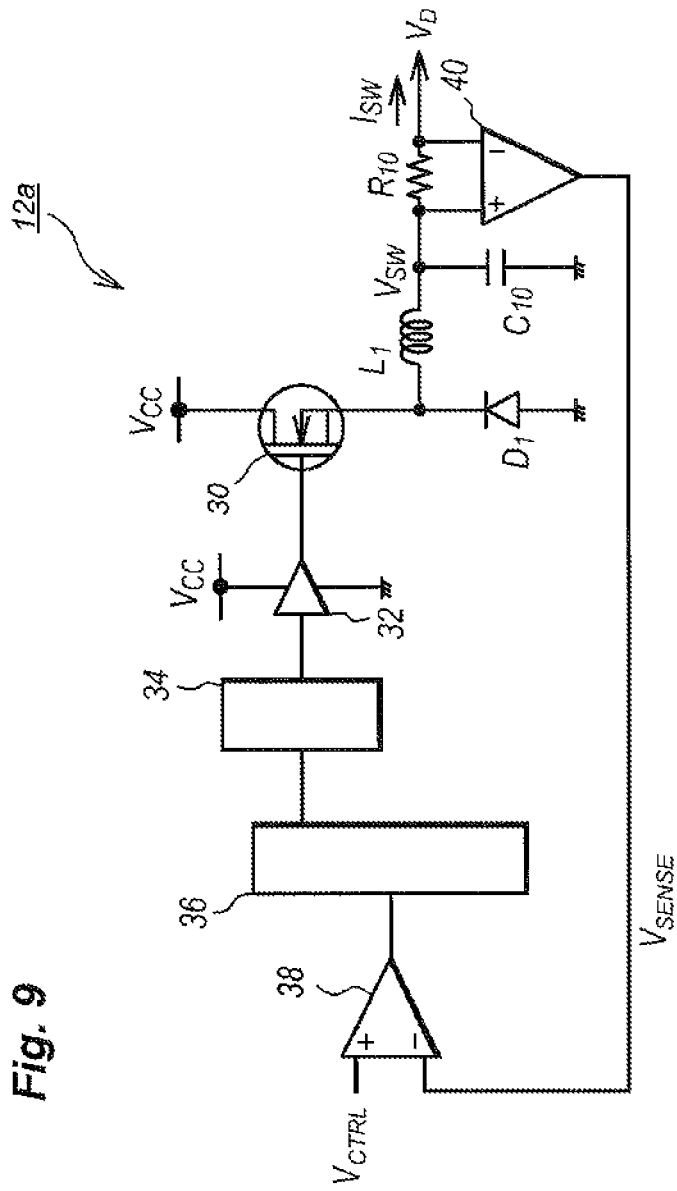
FIG. 9 shows a circuit of a switching power supply with the step-down configuration.

FIG. 9 shows a circuit of the switching power supply 12a with the step-down configuration implemented within the amplifier 110 of the comparable example. The step-down configuration of the switching power supply 12a includes a series circuit of the FET 30 and the diode $D_1$ between the source power supply $V_{CC}$ and ground. When the FET 30 turns on the current flows therein from the source power supply $V_{CC}$ to store the energy in the inductor $L_1$. While, when the FET 30 turns off, the energy stored in the inductor $L_1$ is released not only to charge the capacitor $C_{10}$ but to be outputted as the current $I_{SW}$. The resistor $R_{10}$ detects the magnitude of the output current $I_{SW}$, and this magnitude is fed back to the differential amplifier 38 to be compared with the control signal $V_{CTRL}$. Thus, the switching power supply 12a generates the output current $I_{SW}$ corresponding to the excess amount of the output current $I_L$ of the linear power supply 14 from the preset limit and the supply voltage $V_D$.

The input signal $RF_{IN}$, the envelope signal $V_{ENV}$ thereof, the output voltage $V_L$, the output current $I_L$, and the output power $P_L$ ($=V_L \times I_L$) of the linear power supply 14 are those shown in figures from FIG. 5A to 6C.

Figure 10A:
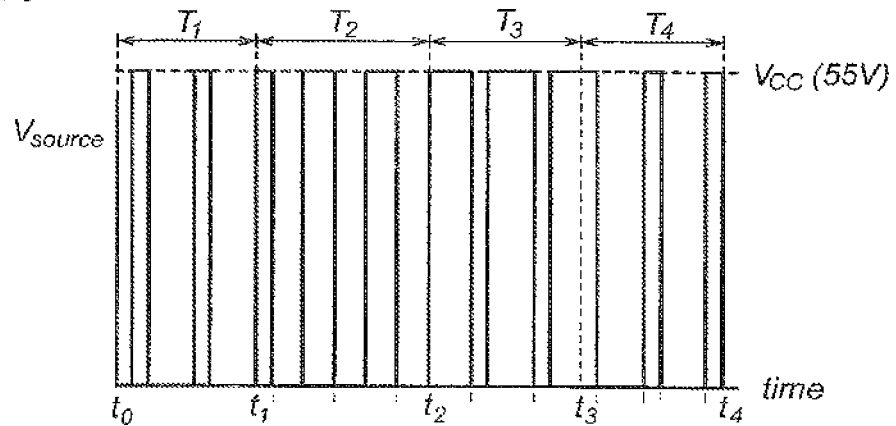
FIG. 10A shows a behavior of the source level $V_{source}$ of the FET driven by the gate driver.
Figure 10B:
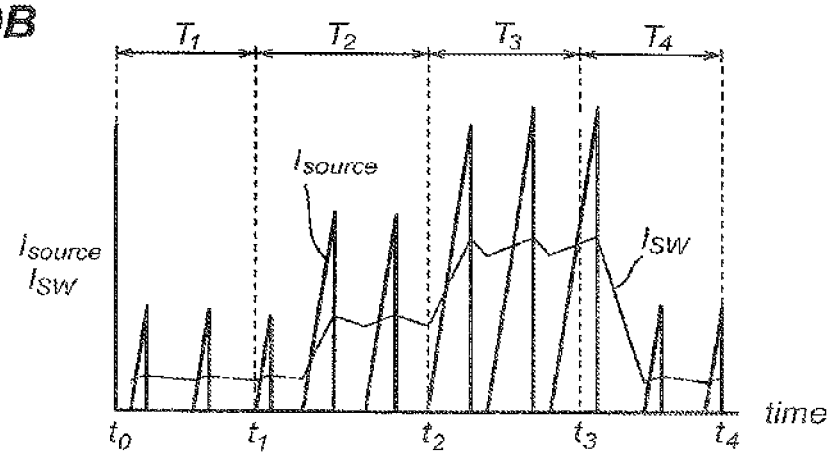
FIG. 10B shows the source current $I_{source}$ output from the FET and the output current $I_{SW}$ output from the inductor through the resistor, and FIG. 10C show power ($I_{SW} \times V_{SW}$) provided from the switching power supply.
Figure 10C:
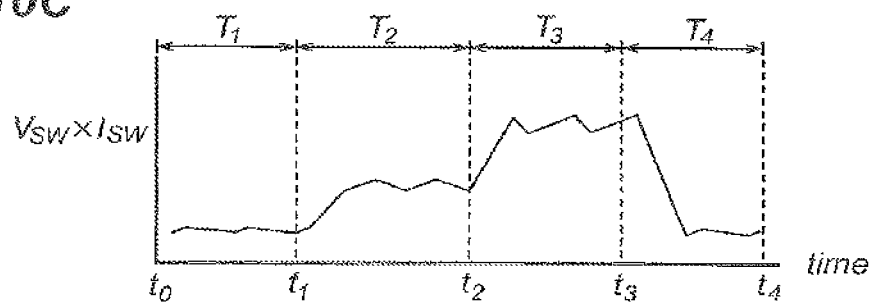

FIG. 10A shows the waveform of the source level of the FET 30, FIG. 10B shows the source current $I_{source}$ of the FET 30 and the output current $I_{SW}$ of the switching power supply 12a, and FIG. 10C shows the power consumption of the switching power supply 12a, namely, $V_{SW} \times I_{SW}$. The source level $V_{source}$ of the FET 30 shows a full swing between the source power supply $V_{CC}$ and the ground. When the FET 30 fully turns on, namely, the HIGH source level, the source current linearly increases to respective maxima in the periods, $T_1$ to $T_4$. In addition, the duty ratio of the driving waveform for the FET 30 becomes a maximum in the period $T_3$ and a minimum in the periods, $T_1$ and $T_4$. The period $T_2$ shows an intermediate duty ratio. According to this driving signal, the switching power supply may provide the output current $I_{SW}$ shown in FIG. 10B to the final section, and the output power supplied to the final section becomes that shown in FIG. 10C.

The switching power supply 12a with the step-down configuration is put between the source power supply $V_{CC}$ and the ground, while, the linear power supply 14 is also put between the source power supply $V_{CC}$ and the ground. That is, the linear power supply 14 and the switching power supply 12a are put in parallel between the source power supply $V_{CC}$ and the ground. In such an arrangement, the power consumption $P_{SW}$ of the switching power supply 12a simply becomes a product of the output voltage $V_{SW}$ and the output current $I_{SW}$ thereof, which means that the power consumption increases as the output voltage $V_{SW}$ increases. The switching power supply 12 of the invention is put between the source power supply $V_{CC}$ and the output of the linear power supply 14. In this arrangement, the power consumption of the switching power supply 12 may be suppressed to a voltage difference between the output voltage $V_L$ of the linear power supply 14 and the source power supply $V_{CC}$ multiplied with the output current $I_{SW}$. The switching power supply 12 of the embodiment only provides a current while the linear power supply 14 provides only a voltage; accordingly, the amplifier 100 of the embodiment may save the power consumption, or enhance the power efficiency.

In an example, assuming the efficiency of the switching power supply 12a with the step-down configuration in the comparable example to be 95%, the switching power supply 12a shows the maximum power consumption when the supply voltage $V_D$ becomes maximum. Further assuming a condition that the switching power supply 12a outputs the voltage 50 V and the current 4 A at the maximum, then the power consumption by the switching power supply 12a becomes $50V \times 4 A \times (1-0.95) = 10$ W.

On the other hand, assuming the switching power supply with the step-up configuration of the embodiment to be 90%, which is inferior to that of the comparable example, the switching power supply 12a, as schematically illustrating in FIG. 7C, shows a maximum power loss when the supplied voltage $V_D$ is moderate. Further assuming a condition that the supplied voltage of 25 V and the current 2 A, then the power loss or the power consumption by the switching power supply 12 becomes, $25V \times 2 A \times (1-0.9) = 5$ W. The switching power supply with the synchronous rectification type 12A shown in FIG. 4 may further enhance the power efficiency to about 95%; then, the power consumption or the power loss by the switching power supply 12A becomes only 2.5 W.

The switching power supply 12 of the present embodiment generates a voltage with respect to the output voltage $V_L$ of the linear power supply 14; that is, the switching power supply 12 with the step-up configuration generates an output higher than the source power supply $V_{CC}$ with respect to the voltage output $V_L$ of the linear power supply 14 but provides a current $I_{SW}$ additional to the output current $I_L$ to the final section 10 of the amplifier 100. Thus, the amplifier 100 may reduce the power consumption without degrading the response to the input envelope.

Second Embodiment

Figure 11:
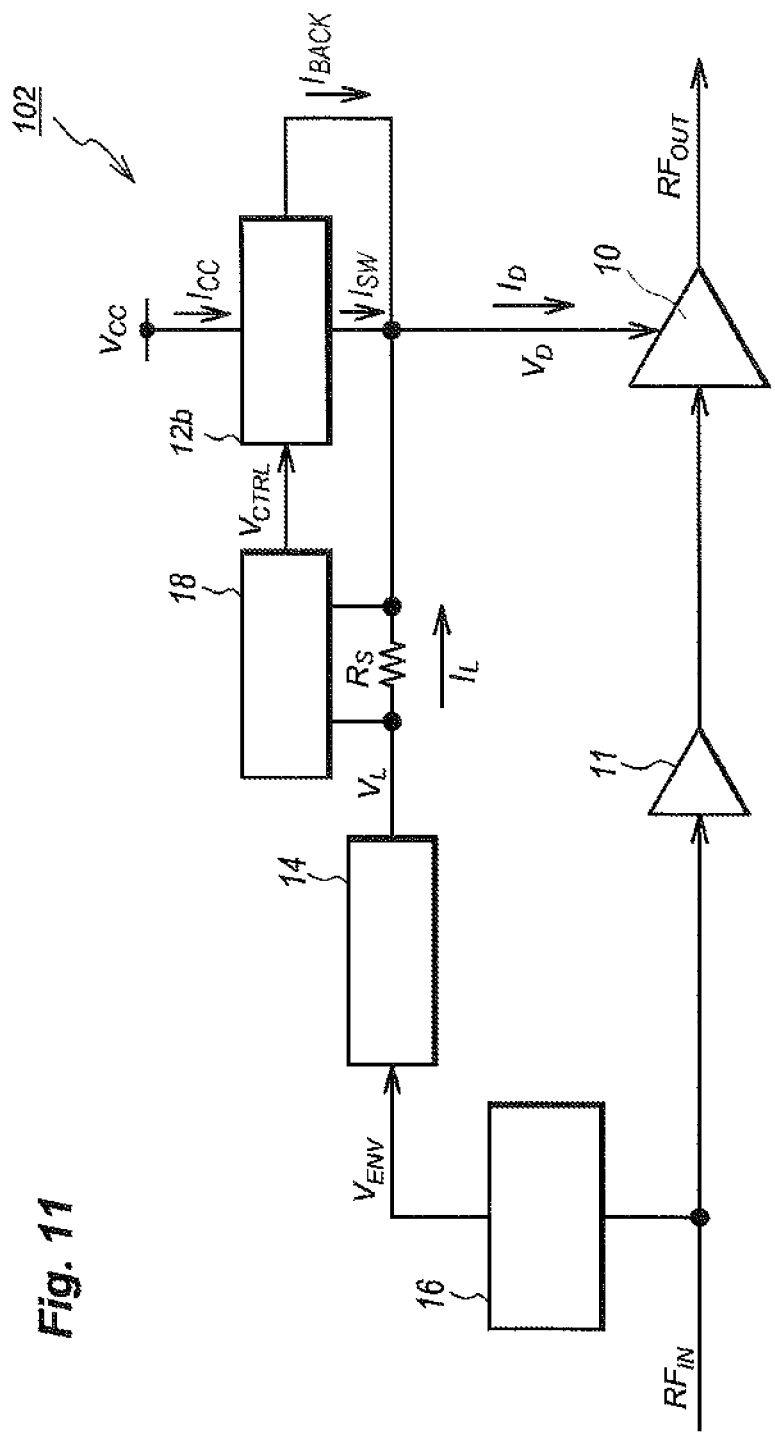
FIG. 11 shows a functional block diagram of an RF amplifier of the second embodiment of the present invention.

FIG. 11 shows a functional block diagram of an amplifier according to the second embodiment of the invention. The amplifier 102 implements, substituted for the switching power supply 12 with the step-up configuration, a switching power supply 12B with the step-down configuration between the output of the linear amplifier 14 and the source power supply $V_{CC}$.

Figure 12:
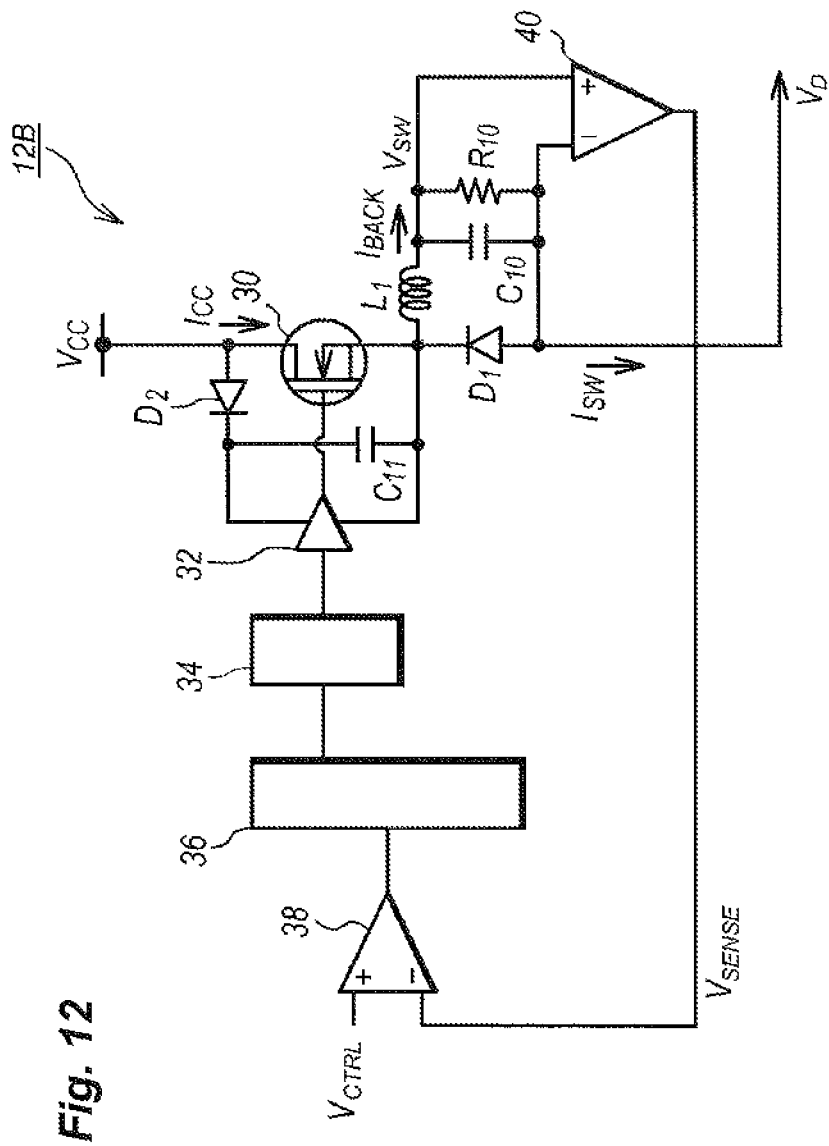
FIG. 12 is a circuit diagram of the switching power supply with the step-down configuration.

FIG. 12 is a circuit diagram of the switching power supply 12B with the step-down configuration. The step-down switching power supply 12B shown in FIG. 12 is the type of the asynchronous rectification having a diode $D_1$. That is, the switching power supply 12B includes a series circuit of an FET 30 and a diode $D_1$ between the source power supply $V_{CC}$ and the output $V_D$. Turning on the FET by the gate driver 32, a current from the source power supply $V_{CC}$ flows in the inductor $L_1$ and the resistor $R_{10}$ to the output $V_D$. On the other hand, turning off the FET 30, a circular circuit of the diode $D_1$, the inductor $L_1$ and the resistor $R_{10}$ is isolated from the source power supply $V_{CC}$ and the energy stored in the inductor $L_1$ during a period when the FET 30 turns on is released in this circular circuit. A rectification circuit of a diode $D_2$ and a capacitor $C_{11}$ generates a power supply for the gate driver 32. Thus, the switching power supply 12B generates a voltage $V_{SW}$, with respect to the output of the linear power supply 14, lower than the source power supply $V_{CC}$, where a practical value of the voltage $V_{SW}$ depends on the duty ratio of a signal to drive the FET 30.

The differential amplifier 40 detects a voltage difference, $V_{SW} - V_D = V_{SENSE}$, generated by the switching power supply 12B, and feeds this difference $V_{SENSE}$ back to the differential amplifier 38. As already explained, the differential amplifier 38 receives the control signal $V_{CTRL}$ that corresponds to the excess amount of the current $I_L$ output from the linear amplifier 14 from the preset limit. The feedback loop of the switching power supply 12B to the differential amplifier 38 operates such that the sensing signal $V_{SENSE}$ becomes equal to the control signal $V_{CTRL}$, that is, the output $V_{SW}$ the switching power supply 12B with respect to the output $V_D$ becomes equal to the excess amount of the current $I_L$ from the preset limit. Thus, the excess amount of the current $I_L$ output from the linear amplifier 14 may be compensated by the switching power supply 12B with the step-down configuration.

Figure 13:
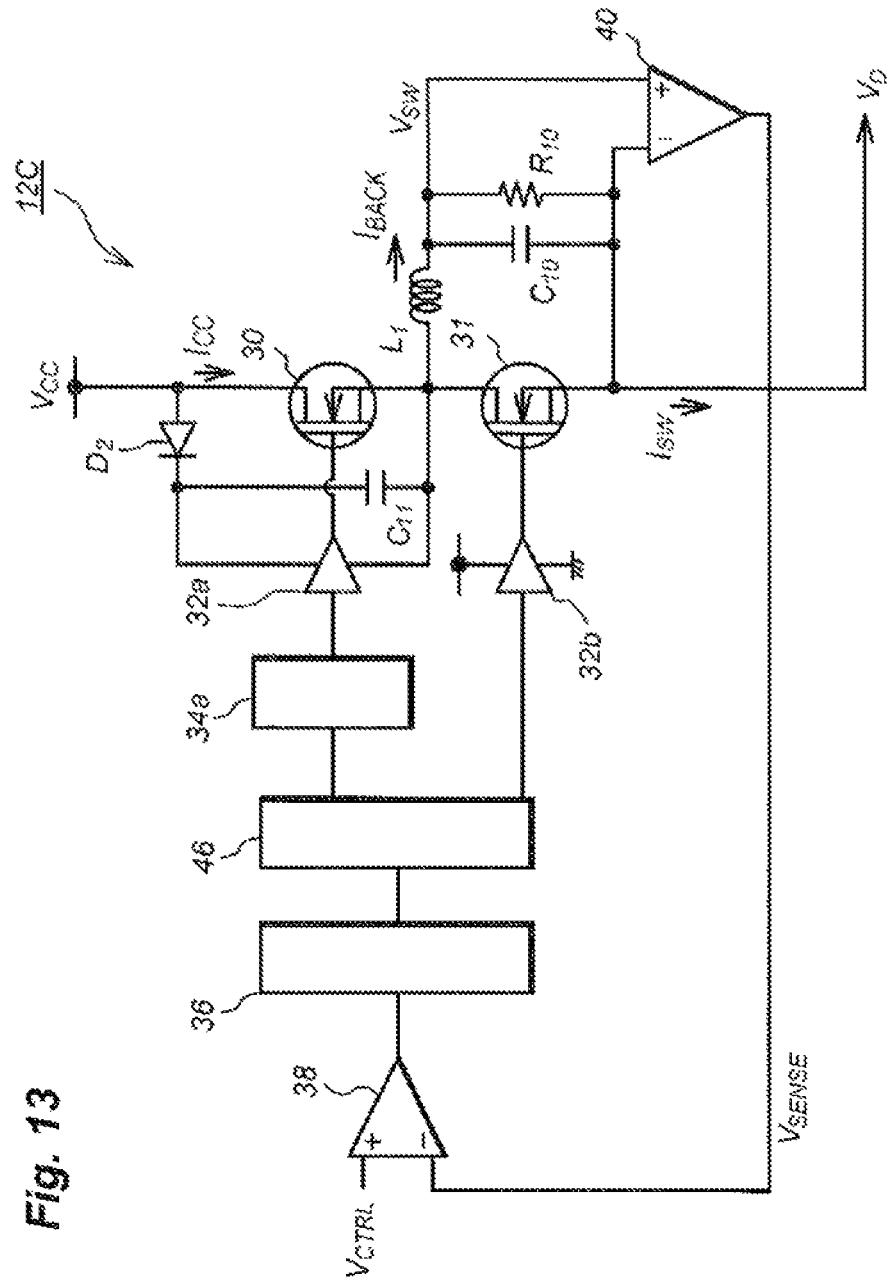
FIG. 13 is a circuit diagram of still another switching power supply with the step-down configuration.

FIG. 13 shows a circuit of another example of the switching power supply 12C that provides the arrangement of, what is called, the synchronous rectification. That is, the switching power supply 12C provides, instead of the diode $D_1$, another FET 31 driven by the low-side gate driver 32b. Two FETs, 30 and 31, are complimentarily driven but without any period when two FETs simultaneously turn on. That is, as already described, when the upper side FET 30 turns on and the lower side FET 31 turns off, the current not only flows in the inductor $L_1$ and the resistor $R_{10}$ to the output from the source power supply $V_{CC}$ but stores energy in the inductor $L_1$. On the other hand, when the upper side FET 30 turns off and the lower side FET 31 turns on, the energy stored in the inductor $L_1$ is released through the resistor $R_{10}$; thus, the current corresponding to the difference, $V_{SW}-V_D$, is provided to the output $V_D$.

Setting the preset limit of the current $I_L$ output from the linear power supply 14 to be relatively small, the switching power supply, 12 to 12C, may provide the excess amount of the current provided to the final section 10. However, the switching power supply, 12 to 12C, may not follow prompt transitions of the envelope of the input RF signal $RF_{IN}$. The linear power supply 14 may compensate this excess amount and the linear power supply 14 finally only provides the preset limit current.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An amplifier for amplifying radio frequency (RF) signals, comprising:
    a field effect transistor (FET) to be supplied with a supply voltage and a supply current;
    a linear power supply to provide the supply voltage and a portion of the supply current to the FET as responding an envelope of the RF signals by receiving a source power supply; and
    a switching power supply superposed on the linear power supply, the switching power supply providing a rest portion of the supply current to the FET from the source power supply by receiving the source power supply,
    wherein the switching power supply has a step-up configuration with a reference output and a step-up output, the reference output being connected to an output of the linear power supply to provide the rest portion of the supply current to the FET.

2. The amplifier of claim 1,
    wherein the linear power supply provides the portion of the supply current less than a preset limit, and the switching power supply provides the rest portion of the supply current exceeding the preset limit.

3. The amplifier of claim 1,
    wherein the step-up output of the switching power supply is connected to the source power supply through a resistor.

4. The amplifier of claim 1,
    wherein the step-up output of the switching power supply has a difference against the source power supply corresponding to an excess amount of the portion of the supply current provided from the linear power supply to the FET.

5. The amplifier of claim 4,
    wherein the switching power supply includes a series circuit of an inductor and a switching FET, and another series circuit of a diode and a capacitor, the series circuit being connected between the source power supply and the reference output, the another series circuit being connected in parallel to the switching FET.

6. The amplifier of claim 4,
    wherein the switching power supply includes a series circuit of an inductor and a switching FET and another series circuit of another FET and a capacitor, the series circuit being connected between the source power supply and the reference output, the another series circuit being connected in parallel to the switching FET, the switching FET and the another FET being driven complementarily.

7. The amplifier of claim 6,
    wherein the switching FET and the another FET never turn on simultaneously.

8. An amplifier for amplifying radio frequency (RF) signals, comprising:
    a field effect transistor (FET) to be supplied with a supply voltage and a supply current;
    a linear power supply to provide the supply voltage and a portion of the supply current to the FET as responding an envelope of the RF signals by receiving a source power supply; and
    a switching power supply superposed on the linear power supply, the switching power supply providing a rest portion of the supply current to the FET from the source power supply by receiving the source power supply,
    wherein the switching power supply has a step-down configuration with a reference output and a step-down output, the reference output being connected to an output of the linear power supply to provide the rest portion of the supply current to the FET.

9. The amplifier of claim 8,
    wherein the step-down output of the switching power supply is connected to the reference output through a resistor.

10. The amplifier of claim 8,
    wherein the step-down output of the switching power supply has a difference against the reference output corresponding to an excess amount of the portion of the supply current provided from the linear power supply to the FET.

11. The amplifier of claim 8,
    wherein the switching power supply includes a series circuit of a switching FET and a diode, and another series circuit of an inductor and a capacitor, the series circuit being connected between the source power supply and the reference output, the another series circuit being connected in parallel to the diode.

12. The amplifier of claim 8,
    wherein the switching power supply includes a series circuit of a switching FET and another FET, and another series circuit of an inductor and a capacitor, the series circuit being connected between the source power supply and the reference output, the another series circuit being connected in parallel to the another FET, the switching FET and the another FET being driven complementarily.

13. The amplifier of claim 12,
wherein the switching FET and the another FET never turn on simultaneously.

14. The amplifier of claim 8,
wherein the linear power supply provides the portion of the supply current less than a preset limit, and the switching power supply provides the rest portion of the supply current exceeding the preset limit.

* * * * *